(12) United States Patent
Chen et al.

(10) Patent No.: US 9,756,734 B2
(45) Date of Patent: Sep. 5, 2017

(54) MANUFACTURING METHOD FOR BACK DRILLING HOLE IN PCB AND PCB

(71) Applicants: PEKING UNIVERSITY FOUNDER GROUP CO., LTD., Beijing (CN); ZHUHAI FOUNDER TECH. HI-DENSITY ELECTRONIC CO., LTD., Zhuhai (CN); FOUNDER INFORMATION INDUSTRY HOLDINGS CO., LTD., Beijing (CN)

(72) Inventors: Xianren Chen, Zhuhai (CN); Baowei Ren, Zhuhai (CN)

(73) Assignees: PEKING UNIVERSITY FOUNDER GROUP CO., LTD., Beijing (CN); ZHUHAI FOUNDER TECH. HI-DENSITY ELECTRONIC CO., LTD., Zhuhai (CN); FOUNDER INFORMATION INDUSTRY HOLDINGS CO., LTD., Beijing (CN)

( * ) Notice: Subject to any disclaimer, the term of this patent is extended or adjusted under 35 U.S.C. 154(b) by 0 days.

(21) Appl. No.: 14/909,176

(22) PCT Filed: Nov. 28, 2013

(86) PCT No.: PCT/CN2013/088042
§ 371 (c)(1),
(2) Date: Feb. 1, 2016

(87) PCT Pub. No.: WO2015/014051
PCT Pub. Date: Feb. 5, 2015

(65) Prior Publication Data
US 2016/0150653 A1    May 26, 2016

(30) Foreign Application Priority Data
Aug. 2, 2013 (CN) .......................... 2013 1 0334885

(51) Int. Cl.
H05K 3/00 (2006.01)
H05K 3/42 (2006.01)
H05K 1/11 (2006.01)

(52) U.S. Cl.
CPC .......... H05K 3/0047 (2013.01); H05K 1/115 (2013.01); H05K 3/0094 (2013.01); H05K 3/427 (2013.01);
(Continued)

(58) Field of Classification Search
CPC .... H05K 3/0047; H05K 3/427; H05K 3/0094; H05K 1/115
(Continued)

(56) References Cited

U.S. PATENT DOCUMENTS

| 5,716,168 A | 2/1998 | Janoff | |
|---|---|---|---|
| 2004/0134682 A1* | 7/2004 | En | C23C 18/1607 174/258 |
| 2005/0162835 A1* | 7/2005 | Kogure | H05K 3/0055 361/720 |

FOREIGN PATENT DOCUMENTS

| CN | 102523699 A | 6/2012 |
|---|---|---|
| CN | 102523702 A | 6/2012 |
| CN | 102958289 A | 3/2013 |

OTHER PUBLICATIONS

International Search Report for International Application No. PCT/CN2013/088042 dated Apr. 21, 2014; Mailed May 5, 2014; 2 pages.

* cited by examiner

*Primary Examiner* — Timothy Thompson
*Assistant Examiner* — Charles Pizzuto
(74) *Attorney, Agent, or Firm* — Cantor Colburn LLP

(57) ABSTRACT

A method for manufacturing a back drilling hole in a printed circuit board (PCB) and PCB are provided. The method for manufacturing the back drilling hole comprises: forming a
(Continued)

through hole in the PCB (1); forming a metal layer (12) with prescribed thickness on an inner wall of the through hole; filling resin in the through hole which has been formed with the metal layer (12); performing back drilling machining on the through hole which has been filled with the resin; removing metal scraps remained in the through hole. The manufacturing method protects the hole wall copper by filling the hole with the resin, so that acid corrosion process only removes the remained metal scraps after back drilling of the small hole, does not affect on the hole copper of the resin protecting portion.

7 Claims, 7 Drawing Sheets

(52) U.S. Cl.
CPC ............... *H05K 2201/0959* (2013.01); *H05K 2203/0207* (2013.01); *H05K 2203/0214* (2013.01)

(58) Field of Classification Search
USPC ............................................ 174/266; 29/852
See application file for complete search history.

--Prior Art--

--Prior Art--

--Prior Art--

--Prior Art--

--Prior Art--

--Prior Art--

--Prior Art--

--Prior Art--

--Prior Art--

MANUFACTURING METHOD FOR BACK DRILLING HOLE IN PCB AND PCB

This application is a US National Stage of International Application No. PCT/CN2013/088042, filed on Nov. 28, 2013, designating the United States and claiming the priority to Chinese Patent Application No. 201310334885.4, filed with the State Intellectual Property Office of People's Republic of China on Aug. 2, 2013 and entitled "A method for fabricating back-drilled holes on a PCB, and a PCB", the content of which is hereby incorporated by reference in its entirety.

FIELD

The present invention relates to the field of producing electronic products and particularly to a method for fabricating back-drilled holes on a PCB, and a PCB.

BACKGROUND

Back-drilled holes have been increasingly widely applied in the existing industry of Printed Circuit Boards (PCBs), and the back-drilled holes are an important factor in a design of PCBs particularly for existing electronic products transmitting signals at a high speed.

When fabricating a PCB, through-holes need to be set for connection between respective inner layers of lines, where copper deposition, electroplating, and other processes need to be further performed on the through-holes to form electrically conductive layers in the through-holes to thereby connect the respective layers of lines. However through-holes of some PCBs need to be only partially conducting, whereas the through-holes on which copper deposition and electroplating are performed are completely conducting, so that there may be such a problem arising with connected ends of the through-holes that a signal may travel back so that the signal being transmitted may be reflected, scattered, delayed, etc., so the signal may be "distorted". In order to prevent this from arising, the through-holes need to be back drilled.

Along with constant progress of the electronic products, there has been an increasingly stringent requirement on a back-drilling process for the design of the electronic products, and particularly if small holes (with an aperture at or below 0.25 millimeter) for the design of the high-speed electronic products are back drilled, then it is required that no copper wire can remain in the back-drilled small holes.

In view of the requirement above, a practice in the industry to deal with the copper wires remained in the back-drilled small holes is to design an alkaline etching flow process. FIG. 1a to FIG. 1i are schematic structural diagrams of respective operations in a flow of a method for fabricating back-drilled holes on a PCB in the prior art, and as illustrated in FIG. 1a to FIG. 1i, the alkaline etching flow process generally includes opening a material, transferring an inner pattern, browning, laminating an outer board to form a PCB 01 (as illustrated in FIG. 1a), drilling 011 (as illustrated in FIG. 1b), depositing copper and pre-plating the board (the thickness of the copper 02 in the holes is controlled ranging from 5 micrometer to 8 micrometer, and illustrated in FIG. 1c as a thickened layer in the holes, although the thickened part of surface copper is not illustrated), placing a dry film 03, transferring an outer alkaline pattern (as illustrated in FIG. 1d), electro-plating the pattern (the thickness of the copper in the respective holes is sufficiently plated as required by a customer, as illustrated in FIG. 1e), plating tin 04 at positions where lines are windowed (as illustrated in FIG. 1f), back-drilling (as illustrated in FIG. 1g), removing the dry film (as illustrated in FIG. 1h), alkaline etching (as illustrated in FIG. 1i), etc.

However although the problem of the copper wires remained in the back-drilled small holes can be addressed in the alkaline etching flow process above, there may be numerous drawbacks generally including the following items:

1. The alkaline etching flow process designed for back-drilling the small holes is very complicated and comes with a long production flow, thus resulting in low productivity.

2. There is a very stringent requirement on the thickness of the base copper on the PCB in alkaline etching, where generally the thickness of the base copper needs to be controlled within 50 micrometers; otherwise, fine lines (with a line width generally no more than 4 mils, where 1 mill is approximately 25.4 micrometers) might fail to be etched as required.

3. Surface copper needs to be plated twice in the alkaline etching flow process designed for back-drilling the small holes, so that the surface copper may easily become excessive in thickness, and the small holes may become smaller in diameter, making it very difficult to plate tin in the small holes, so there may be no sufficient tin in the holes to protect the hole copper, so that the copper which should not be etched may be etched away in subsequent etching for removing the copper wires remained in the back-drilled holes, and thus the small holes may easily be rejected due to the absence of copper therein.

SUMMARY

The invention provides a method for fabricating back-drilled holes on a PCB in a simple process by protecting hole copper through filling the holes with resin so that only metal scraps remained in the back-drilled small holes can be removed in acidic etching without affecting the part of the hole copper protected by the resin.

The invention further provides a PCB including the back-drilled holes above in which there are no metal scraps remained and a part of hole copper is remained intact.

In order to attain the object above, the invention provides the following technical solutions:

The invention provides a method for fabricating back-drilled holes on a PCB, the method including:

forming through-holes on a PCB;

forming a metal layer with a preset thickness on inner walls of the through-holes;

filling resin in the through-holes in which the metal layer is formed;

back-drilling the through-holes filled with the resin; and removing metal scraps remained in the through-holes.

In the method for fabricating back-drilled holes on a PCB according to the embodiment of the invention, the metal layer is formed with the preset thickness on the inner walls of the through-holes in only one electro-plating process to thereby simplify the fabrication process and avoid the thickness of the metal layer from becoming larger due to a significant error generated in two electro-plating processes; and also firstly the holes are filled with the resin and then back-drilled, and further the metal scraps remained in the back-drilled through-holes are removed through acidic etching, so such a problem can be avoided that the through-holes with a small aperture become smaller in aperture after the metal is electro-plated twice in the holes so that it may be not easy to electro-plate tin therein, and consequently the hole copper which should not be etched away cannot be protected.

Thus with the method for fabricating back-drilled holes on a PCB according to the embodiment of the invention, the fabrication process can be simplified; and the base copper can be avoided from becoming large in thickness in the alkaline etching flow process in the prior art, and also the small holes can be avoided from being rejected due to the absence of copper therein in the alkaline etching flow process in the prior art.

Thus in the method for fabricating back-drilled holes on a PCB according to the invention, the hole copper can be protected by filling the holes with the resin, so only one acidic etching process of electro-plating will be performed so that only the metal scraps remained in the back-drilled small holes will be removed in the acidic etching process without affecting the part of the hole copper protected by the resin, and the fabrication process can be simplified.

BRIEF DESCRIPTION OF THE DRAWINGS

The drawings described here are intended to provide further understanding of the invention, and constitute a part of the invention, and the exemplary embodiments of the invention and the description thereof are intended to set for the invention but not to unduly limit the invention. In the drawings.

Figure 1A:
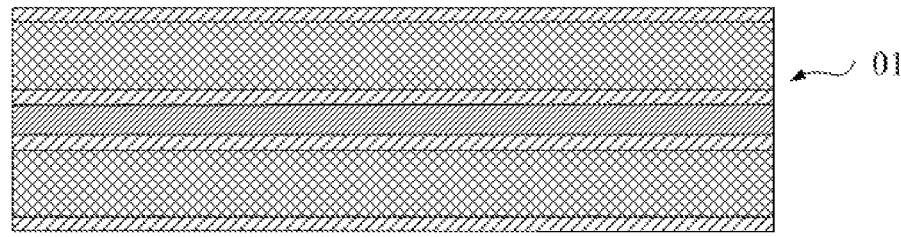
FIG. 1a to FIG. 1i are schematic structural diagrams of respective operations in a flow of a method for fabricating back-drilled holes on a PCB in the prior art.
Figure 1B:
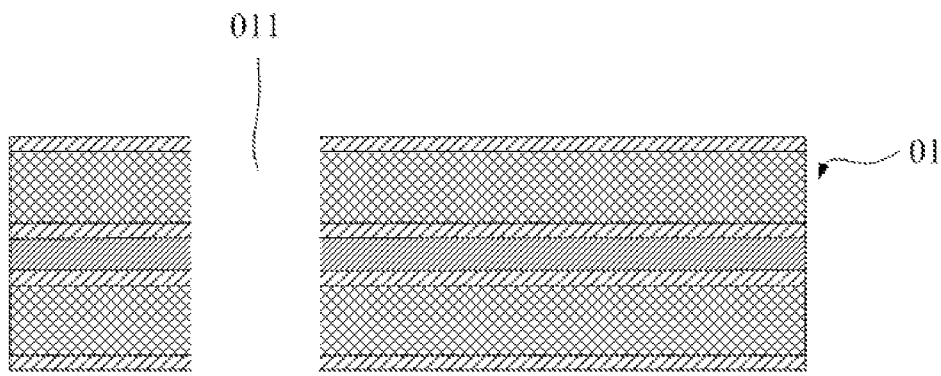
Figure 1C:
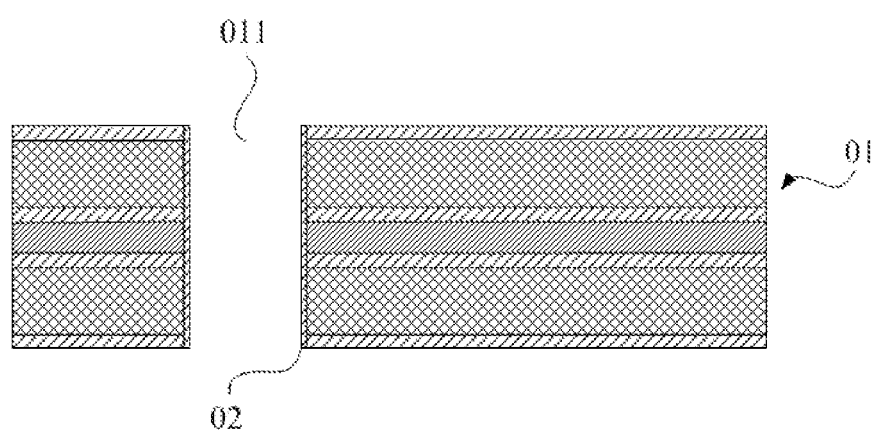
Figure 1D:
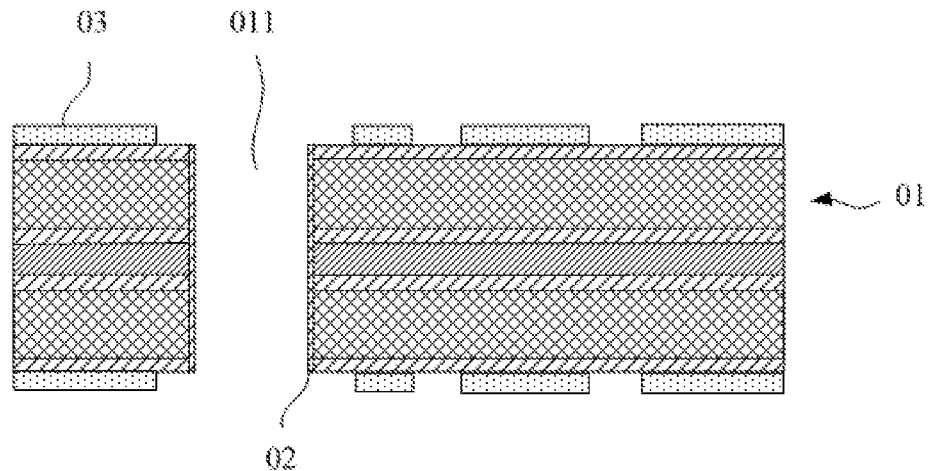
Figure 1E:
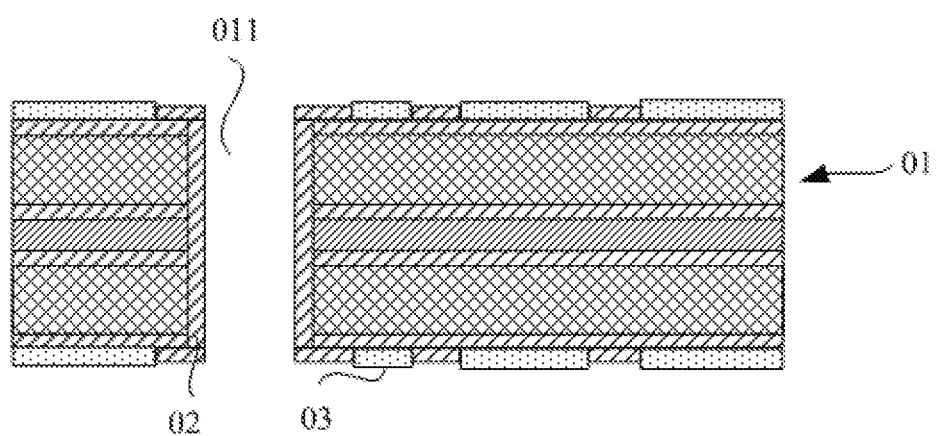
Figure 1F:
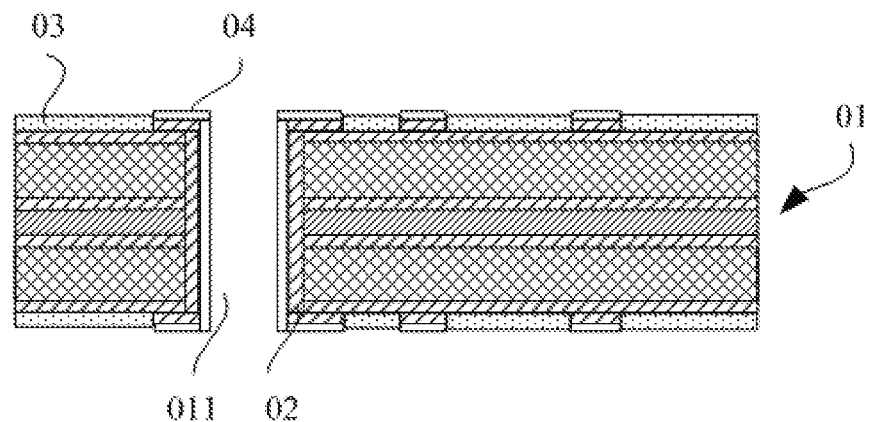
Figure 1G:
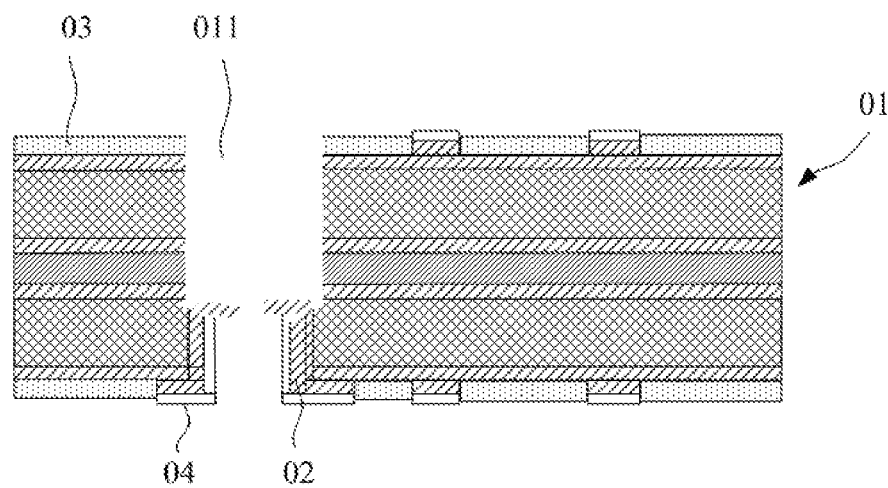
Figure 1H:
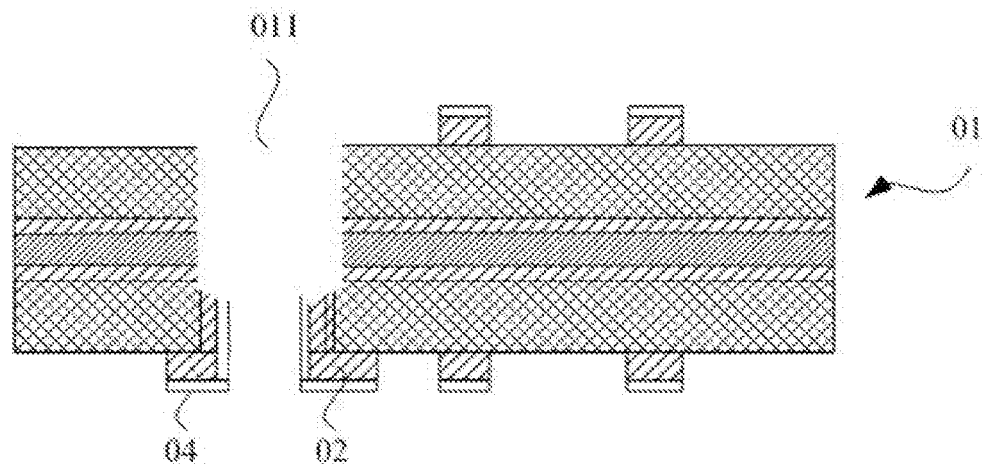
Figure 1I:
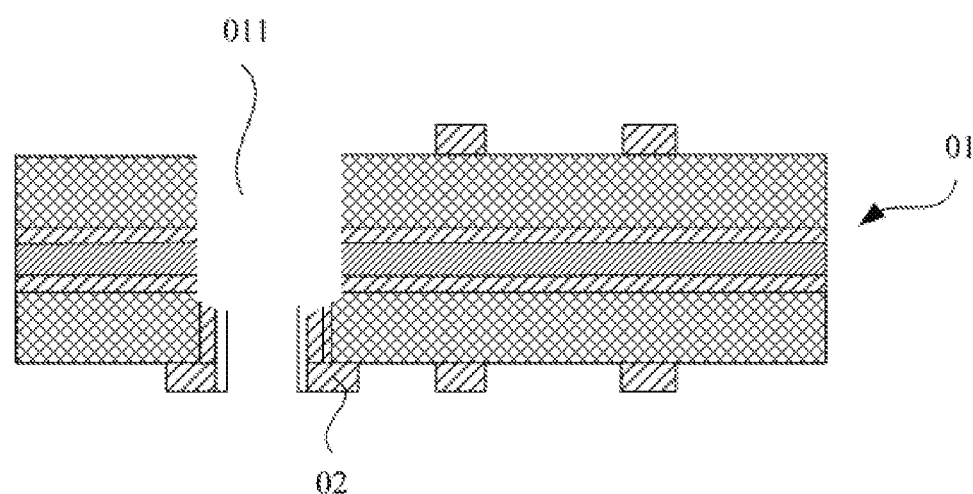

In the drawings:
01 PCB; 011 Drilled-hole; 02 Copper; 03 Dry film; 04 Tin; 1 PCB; 11 Through-hole; 12 Metal layer; 121 Metal scrap; 2 Resin

DETAILED DESCRIPTION OF THE EMBODIMENTS

In order to make the technical problem to be addressed by the invention, and the technical solutions, and advantageous effects, of the invention more apparent, the invention will be described below in further details with reference to the drawings and in connection with the embodiments thereof. It shall be appreciate that the particular embodiments described here are merely intended to set forth but not limit the invention.

It shall be noted that the PCB as referred to in the invention is a multi-layer board, and the method for fabricating back-drilled holes as referred to generally back-drills small holes (with an aperture at or below 0.25 millimeter) as an alternative solution for the purpose of overcoming the difficulty with back-drilling small holes, as mentioned in the Background section. Of course, large holes can also be back-drilled using this method.

Figure 2:
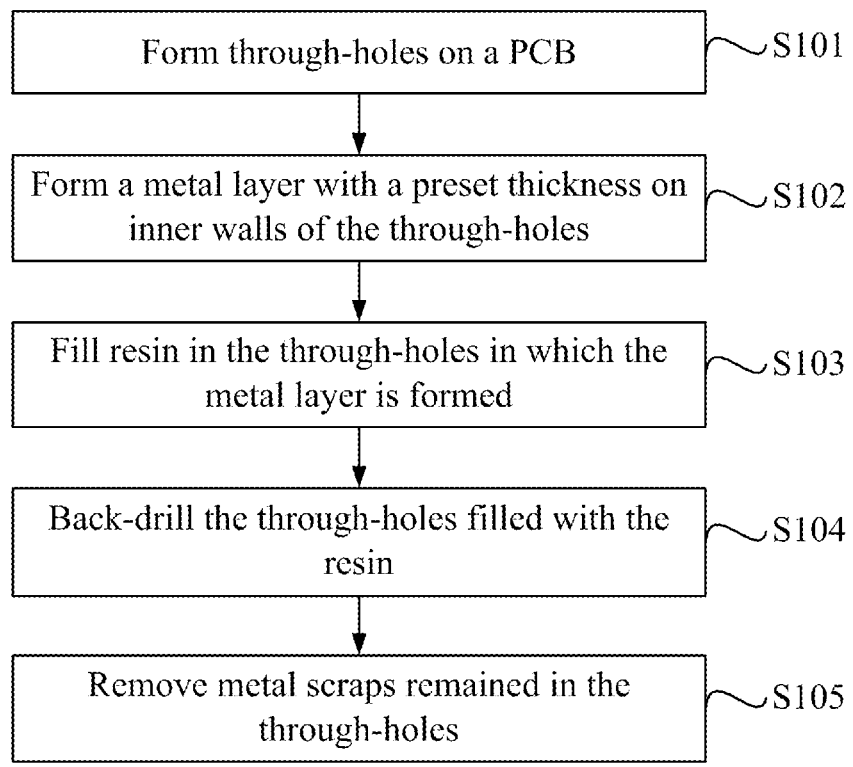
FIG. 2 is a flow chart of a method for fabricating back-drilled holes on a PCB according to the invention.

As illustrated in FIG. 2 which is a flow chart of a method for fabricating back-drilled holes on a PCB according to the invention, the method for fabricating back-drilled holes on a PCB according to an embodiment of the invention includes:

The operation S101 is to form through-holes on a PCB;

The operation S102 is to form a metal layer with a preset thickness on inner walls of the through-holes;

The operation S103 is to fill resin in the through-holes in which the metal layer is formed;

The operation S104 is to back-drill the through-holes filled with the resin; and The operation S105 is to remove metal scraps remained in the through-holes.

In the method for fabricating back-drilled holes on a PCB according to the embodiment of the invention, the metal layer is formed with the preset thickness on the inner walls of the through-holes in only one electro-plating process to thereby simplify the fabrication process and avoid the thickness of the metal layer from becoming larger due to a significant error generated in two electro-plating processes, where the metal is electro-plated in the one electro-plating process; and also firstly the holes are filled with the resin and then back-drilled, and further the metal scraps remained in the back-drilled through-holes are removed through acidic etching, so such a problem can be avoided that the through-holes with a small aperture become smaller in aperture after the metal is electro-plated twice in the holes so that it may be not easy to electro-plate tin therein, and consequently the hole copper which should not be etched away cannot be protected.

Thus in the method for fabricating back-drilled holes on a PCB according to the embodiment of the invention, the fabrication process can be simplified; and the base copper can be avoided from becoming large in thickness in the alkaline etching flow process in the prior art, and also the small holes can be avoided from being rejected due to the absence of copper therein in the alkaline etching flow process in the prior art.

Thus in the method for fabricating back-drilled holes on a PCB according to the embodiment of the invention, the copper on the walls of the holes can be protected through filling the holes with resin so that only the metal scraps remained in the back-drilled small holes can be removed in acidic etching without affecting the part of the hole copper protected by the resin; and also the holes are filled with the resin and then back-drilled so that the originally designed alkaline solution is replaced with the simpler acidic etching process, for example, to thereby dispense with one stage of plating the surface copper and one stage of plating tin so as to save a fabrication period of time, to accommodate required environment conservation, and to further guarantee a reduction of the ratio of rejecting boards.

Figure 3:
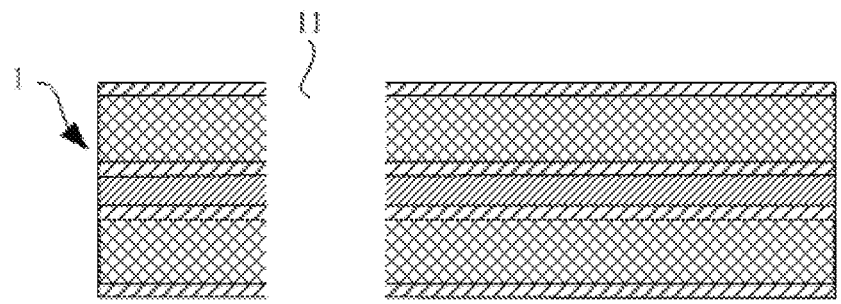
FIG. 3 is a schematic diagram of forming through-holes on the PCB according to an embodiment of the invention.

Particularly in the operation S101, the through-holes 11 are drilled on the PCB 1 using a metal drilling head, as illustrated in FIG. 3 which is a schematic diagram of forming the through-holes on the PCB according to an embodiment of the invention.

Figure 4:
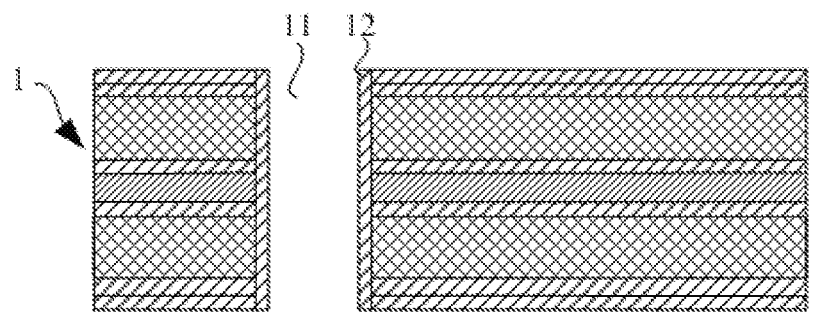
FIG. 4 is a schematic diagram of forming a metal layer on inner walls of the through-holes according to an embodiment of the invention.

Furthermore in the operation S102, the metal layer with the preset thickness is formed on the inner walls of the through-holes particularly by metalizing the inner walls of the through-holes in a metal deposition process, and further forming the metal on the inner walls of the through-holes to the preset thickness in a metal electro-plating process. Both the metal deposition process and the metal electro-plating process are common fabrication processes, as illustrated in FIG. 4 which is a schematic diagram of forming the metal layer on the inner walls of the through-holes according to an embodiment of the invention. After this operation is performed, the metal layer is plated on both the outer layer of the PCB 1 and the inner walls of the through-holes 11.

As required for products in the industry, the preset thickness of the metal layer 12 on the inner walls of the through-holes 11 generally ranges from 13 to 104 micrometers, e.g., 13 micrometer, 23 micrometer, 33 micrometer, 43 micrometer, 53 micrometer, 63 micrometer, 73 micrometer, 83 micrometer, 93 micrometer, 104 micrometer, etc., although a repeated description thereof will be omitted here. Generally the metal with a thickness ranging from 25 micrometer to 35 micrometer is generally applicable in fabrication of medium-end and higher-end products.

Figure 5:
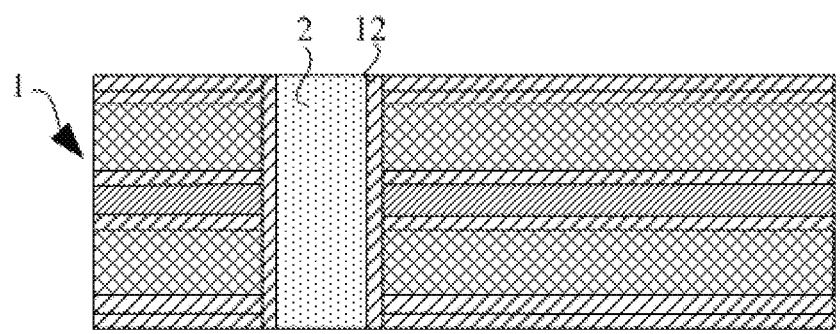
FIG. 5 is a schematic diagram of filling the through-holes with resin according to an embodiment of the invention.

In the operation S103, the through-holes 11 in which the metal layer is formed are filled with the resin particularly by filling the resin 2 in the through-holes in which the metal layer is formed, using an aluminum sheet screen, as illustrated in FIG. 5 which is a schematic diagram of filling the through-holes with the resin according to an embodiment of the invention. After this operation is performed, the through-holes 11 are filled with the resin 2, and preferably the through-holes are filled completely with the resin 2, and thus the copper on the walls of the hole can be protected by filling the holes with the resin so that only metal scraps remained in the back-drilled small holes can be removed in acidic etching without affecting the part of the hole copper protected by the resin.

Figure 6:
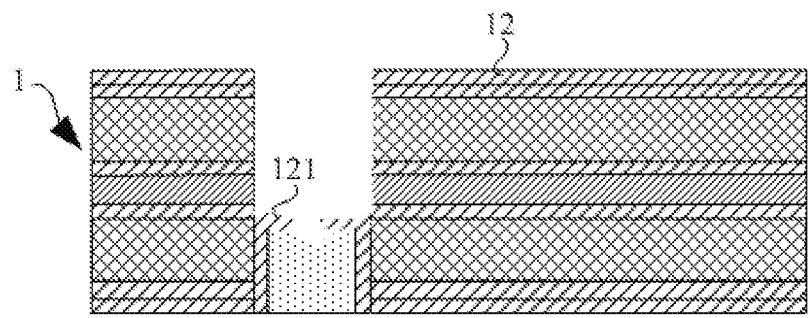
FIG. 6 is a schematic diagram of the back-drilled through-holes according to an embodiment of the invention.

Particularly in the operation S104, the through-holes filled with the resin are generally mechanically back-drilled, and after this operation is performed, the PCB 1 is as illustrated in FIG. 6 which is a schematic diagram of the back-drilled through-holes according to an embodiment of the invention, where as can be apparent, there may be the metal scraps 121 remained in the back-drilled through-holes.

Figure 7:
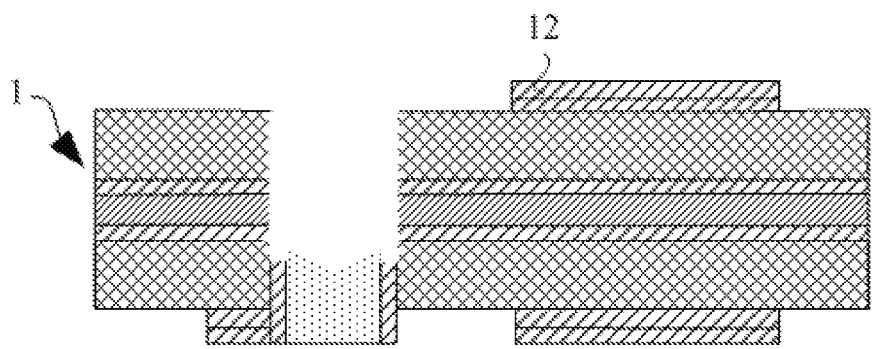
FIG. 7 is a schematic diagram of removing metal scraps remained in the through-holes according to an embodiment of the invention.

In the operation S105, the metal scraps remained in the back-drilled through-holes are removed particularly by covering a dry film on the outer layer of the PCB 1, and etching all the metal scraps remained in the back-drilled through-holes in an acidic etching process while forming a line pattern on the outer layer by transferring the pattern. The dry film can protect the part of the metal layer which does not need to be removed, and after this operation is performed, the PCB 1 is as illustrated in FIG. 7.

An acidic etching solution in the acidic etching process is an industrial vitriol solution which is a common acidic etching solution in a fabrication process, where the content of vitriol in the industrial vitriol solution is more than 92.5%. The concentration of the industrial vitriol solution applied in the embodiment of the invention can be selected as needed, and of course the acidic etching solution can alternatively be another acidic solution, although a repeated description thereof will be omitted here.

The electro-plated metal is generally copper, and the metal scraps remained in the back-drilled through-holes may also be metal wires, metal power, etc.

The invention further provides a PCB including the back-drilled through-holes in which there are no metal scraps remained and a part of hole copper is remained intact.

Evidently those skilled in the art can make various modifications and variations to the invention without departing from the spirit and scope of the invention. Thus the invention is also intended to encompass these modifications and variations thereto so long as the modifications and variations come into the scope of the claims appended to the invention and their equivalents.

The invention claimed is:

1. A method for fabricating back-drilled holes on a PCB, the method comprising:
   forming through-holes on a PCB;
   forming a metal layer with a preset thickness on inner walls of the through-holes;
   filling resin in the through-holes in which the metal layer is formed;
   back-drilling the through-holes filled with the resin; and
   removing metal scraps remained in the through-holes.

2. The method for fabricating back-drilled holes on a PCB according to claim 1, wherein the operation of forming the metal layer with the preset thickness on the inner walls of the through-holes comprises: forming the metal layer with the preset thickness on the inner walls of the through-holes in metal deposition and electro-plating processes.

3. The method for fabricating back-drilled holes on a PCB according to claim 1, wherein the operation of filling the resin in the through-holes in which the metal layer is formed comprises: filling the resin in the through-holes in which the metal layer is formed using an aluminum sheet screen.

4. The method for fabricating back-drilled holes on a PCB according to claim 2, wherein the preset thickness of the metal layer formed on the inner walls of the through-holes ranges from 13 micrometer to 104 micrometer.

5. The method for fabricating back-drilled holes on a PCB according to claim 4, wherein the preset thickness of the metal layer formed on the inner walls of the through-holes ranges from 25 micrometer to 35 micrometer.

6. The method for fabricating back-drilled holes on a PCB according to claim 1, wherein the operation of removing the metal scraps remained in the through-holes comprises: covering a dry film on an outer layer of the PCB, and etching the metal scraps remained in the back-drilled through-holes in an acidic etching process while forming a line pattern on the outer layer by transferring the pattern.

7. The method for fabricating back-drilled holes on a PCB according to claim 1, wherein an aperture of the through-holes is 0.25 millimeter or more.

* * * * *